(12) United States Patent
Wei et al.

(10) Patent No.: US 8,835,233 B2
(45) Date of Patent: Sep. 16, 2014

(54) FINFET STRUCTURE WITH MULTIPLE WORKFUNCTIONS AND METHOD FOR FABRICATING THE SAME

(75) Inventors: Andy C. Wei, Queensbury, NY (US); Akshey Sehgal, Malta, NY (US); Bamidele S. Allimi, Clifton Park, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 109 days.

(21) Appl. No.: 13/539,727

(22) Filed: Jul. 2, 2012

(65) Prior Publication Data
US 2014/0004692 A1 Jan. 2, 2014

(51) Int. Cl.
*H01L 21/84* (2006.01)

(52) U.S. Cl.
USPC ...... 438/153; 438/157; 438/592; 257/E21.24; 257/E21.295; 257/E21.421; 257/E29.275

(58) Field of Classification Search
USPC .................. 438/153, 592, 157; 257/E21.24, 257/E21.295, E21.421, E29.275
See application file for complete search history.

(56) References Cited

U.S. PATENT DOCUMENTS

| 2008/0197424 A1* | 8/2008 | Haensch et al. ............... 257/407 |
| 2008/0265280 A1* | 10/2008 | Currie ........................... 257/190 |
| 2014/0038402 A1* | 2/2014 | Wei et al. ....................... 438/589 |

* cited by examiner

*Primary Examiner* — Zandra Smith
*Assistant Examiner* — Toniae Thomas
(74) *Attorney, Agent, or Firm* — Ingrassia Fisher & Lorenz, P.C.

(57) ABSTRACT

A method for fabricating a multiple-workfunction FinFET structure includes depositing a first workfunction material in a layer in a plurality of trenches of the FinFET structure and etching the first workfunction material layer so as to completely remove the first workfunction material layer from all but a first trench of the plurality of trenches. Further, the method includes depositing a second workfunction material in a layer in the plurality of trenches and etching the second workfunction material layer so as to completely remove the second workfunction material layer from all but a second trench of the plurality of trenches. Still further, the method includes depositing a third workfunction material in a layer in the plurality of trenches.

20 Claims, 22 Drawing Sheets

FINFET STRUCTURE WITH MULTIPLE WORKFUNCTIONS AND METHOD FOR FABRICATING THE SAME

TECHNICAL FIELD

The present invention generally relates to semiconductor devices and methods for fabricating semiconductor devices, and more particularly relates to FinFET structures and methods for fabricating the same.

BACKGROUND

In recent years, the dimensions of MISFETs (metal insulator semiconductor field effect transistors), and in particular the gate electrode thereof, has been decreasing. This dimensional reduction in the MISFET has been performed in accordance with the scaling law, but various problems have appeared as dimensions are reduced. It has therefore become difficult to satisfy both the suppression of the short channel effect of the MISFET while at the same time securing a high current driving power. Accordingly, much research and development has been conducted in recent year regarding devices that have novel structures, that is, structures other than the conventional planar type (flat type) of MISFET.

The FinFET is one of the above-described devices having a novel structure. It is a three-dimensional MISFET different from the planar type MISFET. The FinFET has a "fin" formed by processing a semiconductor layer. This fin is a region in a thin strip form (in the form of a rectangular solid) and both side-surface portions of the fin are used as channels of the FinFET. The gate electrode of the FinFET is formed over both side surface portions of the fin so as to straddle over the fin. It therefore has a so-called "double-gate" structure. The configuration of the FinFET structure is superior to the conventional planar MISFET, which has a single gate structure, from the standpoint of potential control of the channel region by the gate electrode. The FinFET has therefore advantages such as high punch-through resistance between a source region and a drain region, as well as suppression of a short-channel effects even at a smaller gate lengths. Because the FinFET uses the both side surface portions of the fin as a channel, an area of the channel region through which a current is caused to flow can be made greater, and a higher current driving power can be attained.

It has been discovered, however, that it can be difficult to control the threshold voltage of the FinFET. For example, in the conventional planar type MISFET, the threshold voltage is controlled by adjusting the impurity concentration in the channel region. In this case, as the planar type MISFET becomes smaller, the concentration of an impurity to be introduced into the channel region becomes higher in accordance with the scaling law. This means that in the conventional planar type MISFET, size reduction decreases the distance between the source region and the drain region, tending to cause punch-through. The punch-through is therefore controlled by raising the impurity concentration of the channel formed between the source and the drain. An increase in the impurity concentration of the channel however increases the variation in the impurity concentration among elements, resulting in an increase in the variation in the characteristics of the planar type MISFET. In addition, it enhances impurity scattering due to carriers passing through the channel, causing deterioration in the mobility of the carriers.

On the other hand, the FinFET is based on an operating principle similar to that of a fully-depleted MISFET so that the impurity concentration in the channel can be reduced. As such, the FinFET structure is capable of reducing the variation in electrical characteristics among MISFETs due to a high impurity concentration. More specifically, in a FinFET structure, the threshold voltage is controlled not by adjusting the concentration of an impurity to be introduced into the channel, but by selecting an appropriate workfunction of the gate electrode. In the FinFET, once a material of the gate electrode is determined, so too is the threshold voltage. Thus, it is difficult to cover the large range of threshold voltages in current FinFET structures that are needed for more advanced integrated circuit designs.

Accordingly, it is desirable to provide improved FinFET structures, and methods for fabricating the same, that provide for a greater range of threshold voltages. Furthermore, other desirable features and characteristics will become apparent from the subsequent detailed description and the appended claims, taken in conjunction with the accompanying drawings and the foregoing technical field and background.

BRIEF SUMMARY

Disclosed herein are methods for fabricating FinFET structures. In an exemplary embodiment, a method for fabricating a multiple-workfunction FinFET structure includes depositing an n-type workfunction material in a layer over a plurality of fins and in a plurality of trenches between said fins, depositing a DUO material over the n-type workfunction material layer, and differentially etching the DUO material so as to completely remove the DUO material from all but a first trench of the plurality of trenches. At least a portion of the n-type workfunction material remains in the first trench. The method further includes depositing a p-type workfunction material in a layer over the plurality of fins and in the plurality of trenches between said fins, depositing a DUO material over the p-type workfunction material layer, and differentially etching the DUO material so as to completely remove the DUO material from all but a second trench of the plurality of trenches. At least a portion of the p-type workfunction material remains in the second trench. Furthermore, the method includes depositing a mid-gap workfunction material in a layer over the plurality of fins and in the plurality of trenches.

In another exemplary embodiment, a method for fabricating a multiple-workfunction FinFET structure includes depositing a first workfunction material in a layer over a plurality of fins and in a plurality of trenches between said fins, depositing a photoactive etching material over the first workfunction material layer, and differentially etching the photoactive etching material so as to completely remove the photoactive etching material from all but a first trench of the plurality of trenches. At least a portion of the first workfunction material remains in the first trench. The method further includes depositing a second workfunction material in a layer over the plurality of fins and in the plurality of trenches between said fins, depositing a photoactive etching material over the second workfunction material layer, and differentially etching the photoactive etching material so as to completely remove the photoactive etching material from all but a second trench of the plurality of trenches. At least a portion of the second workfunction material remains in the second trench. Still further, the method includes depositing a third workfunction material in a layer over the plurality of fins and in the plurality of trenches.

In yet another exemplary embodiment, a method for fabricating a multiple-workfunction FinFET structure includes depositing a first workfunction material in a layer in a plurality of trenches of the FinFET structure and etching the first workfunction material layer so as to completely remove the first workfunction material layer from all but a first trench of the plurality of trenches. Further, the method includes depositing a second workfunction material in a layer in the plurality of trenches and etching the second workfunction material layer so as to completely remove the second workfunction material layer from all but a second trench of the plurality of trenches. Still further, the method includes depositing a third workfunction material in a layer in the plurality of trenches.

BRIEF DESCRIPTION OF THE DRAWINGS

The disclosed methods will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

For the sake of brevity, conventional techniques related to FinFET semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details. In particular, it is well-known in the art to employ a "dummy" poly silicon gate structure in the initial manufacturing steps of a FinFET semiconductor device. The embodiments described herein, again for the sake of brevity, commence discussion after the fin structures have been formed, and after the "dummy" poly silicon gate structure has been removed.

Reference will now be made to FIGS. 1-10, wherein, in an embodiment, process steps in a method for forming a multiple workfunction gate structure are disclosed. Each figure thereof includes two cross-sectional views of the FinFET structure. One is a cross-section along a fin structure and one is a cross-section in between fin structures, as indicated by the cross-sectional reference diagram included with each figure (with arrows therefrom pointing to the indicated cross-section. It is also noted that the figures include reference dimensions for certain of the described features. These reference dimensions are intended to be exemplary only, and as such it will be appreciated that, based on the design of an integrated circuit, the actual dimensions may vary.

Figure 1A:
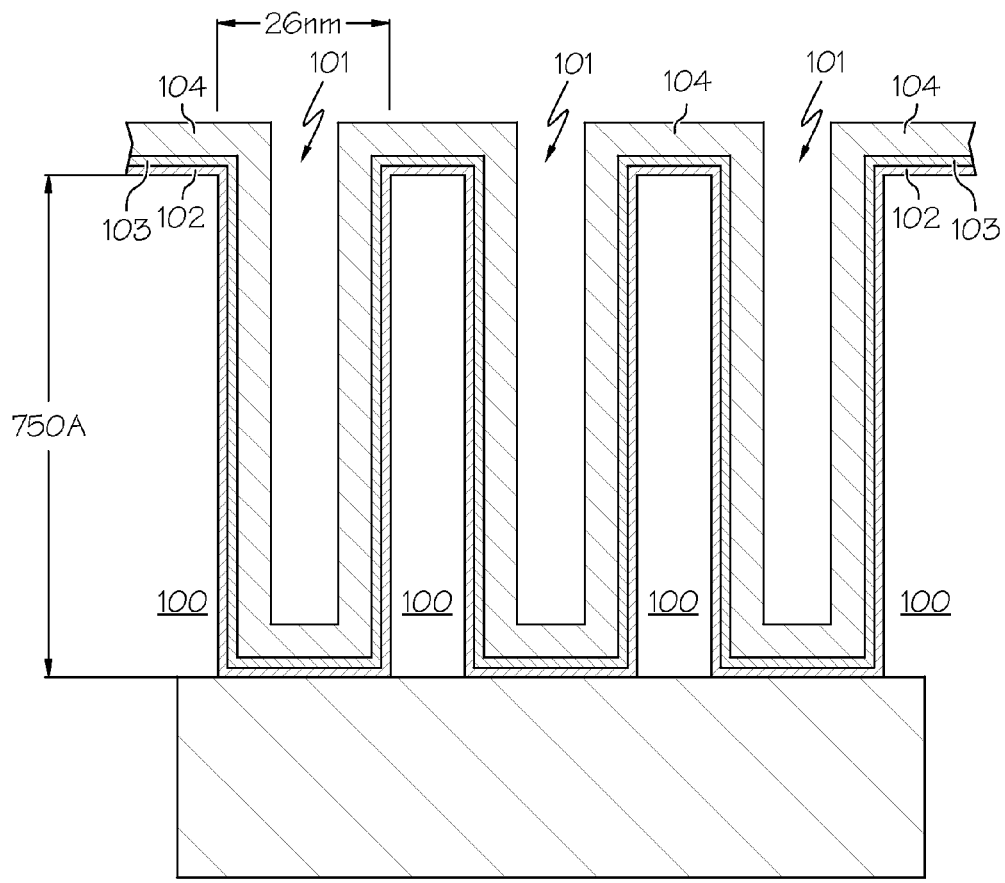
FIGS. 1-10 are partial cross-section views of an integrated circuit system illustrating method steps for forming a multiple workfunction gate structure in accordance with one embodiment.
Figure 1B:
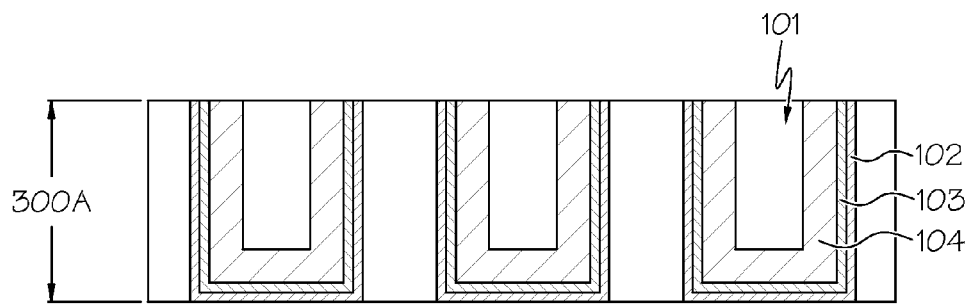

With particular reference now to FIG. 1, a process for forming three gate structures in the fabrication of a FinFET structure is disclosed. The FinFET structure includes a plurality of fins 100, with gaps or "tranches" 101 in between the fins. The exemplary process begins with the deposition of a high-k material 102. The high-k material 102 can include a Hafnium (Hf) or Zirconium (Zr) oxide, or any other metal oxide with sufficient band-gap as are well-known in the art. In an exemplary embodiment, the high-k material 102 is $HfO_2$. The high-k material 102 can be deposited by any technique known in the art that provides for conformal deposition thereof in the trenches 101 and around the fins 100. In one embodiment, the high-k material 102 is deposited using atomic layer deposition (ALD).

With continued reference to FIG. 1, a layer of TiN 103, or other suitable barrier material layer as will be known in the art, is deposited over the high-k material layer 102. This layer 103, in an embodiment, may be about 10 Å in thickness. A sacrificial layer of Si (not shown) deposited over the TiN layer 103. The sacrificial Si layer allows for a subsequent high-temperature annealing of the high-k material 102 to the Si fin 101, thereby improving the high-k material/Si (fin) interface. The sacrificial Si layer is removed after annealing in any suitable manner, for example, anisotropic wet or dry etching.

After annealing and removal of the sacrificial Si layer, an n-type workfunction material 104 is deposited. Any material that is on the n-side of the band-gap, and can be deposited using a process that provides for conformal deposition, for example ALD, may be used. In one embodiment, the n-type workfunction material is TaC. TaC has a workfunction of 4.1 eV, and is suitable for use in an ALD processes. As such, a layer of the TaC or other n-type workfunction material 104 is deposited over the TiN layer 103.

Figure 2A:
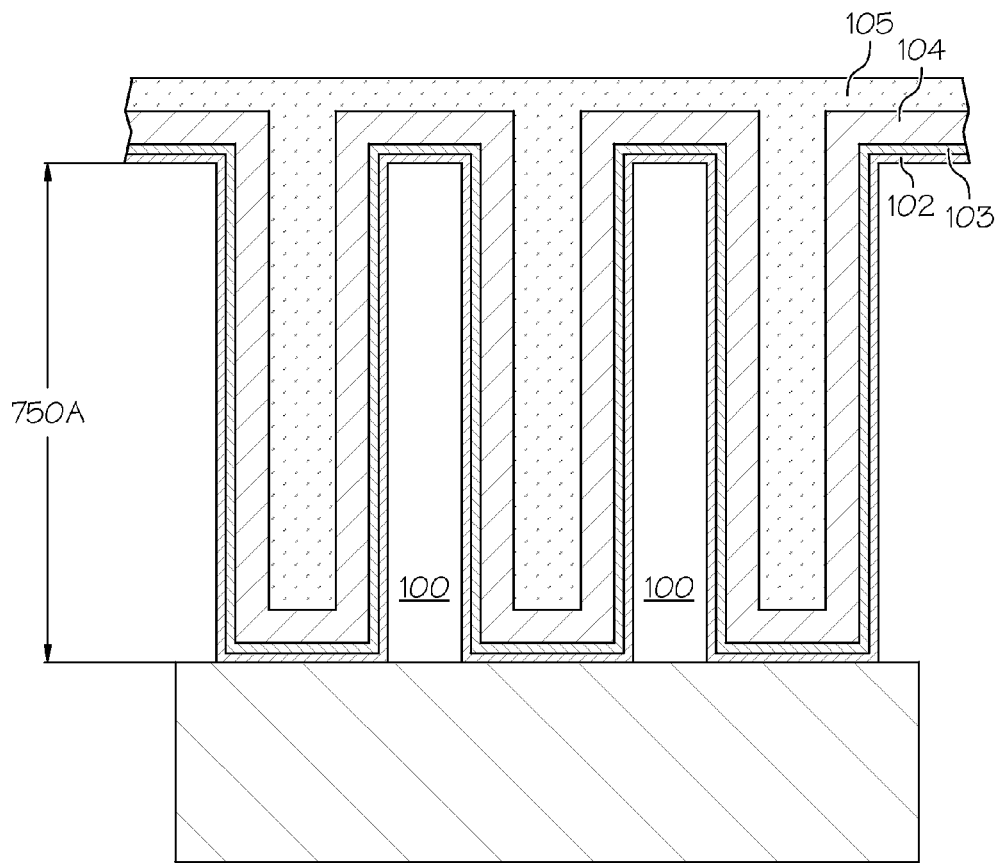
Figure 2B:
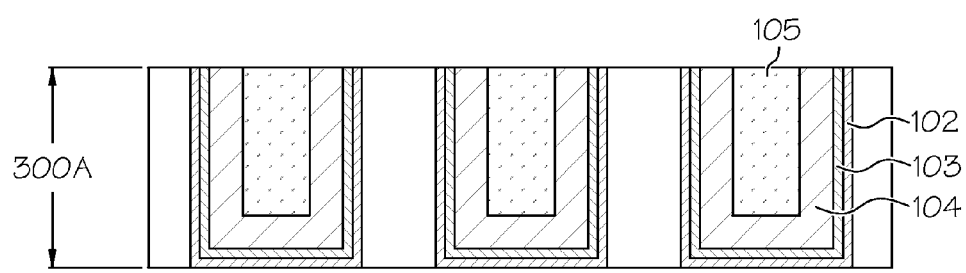

Referring now to FIG. 2, subsequent to the deposition of the n-type workfunction material 104, a layer of a deep ultraviolet light-absorbing oxide (DUO) 105 is conformally deposited. The DUO material, which is a photoactive etching material, is used in connection with deep ultraviolet lithography to for differential etching. As shown in FIG. 2, a DUO layer 105 is deposited over the n-type workfunction layer 104. The DUO layer 105 is also deposited so as to fill the trenches 101. With the DUO layer 105 in place, lithography techniques well-known in the art can be employed to differentially etch the DUO material 105 such that it is only removed from desired locations, using a pattern.

Figure 3A:
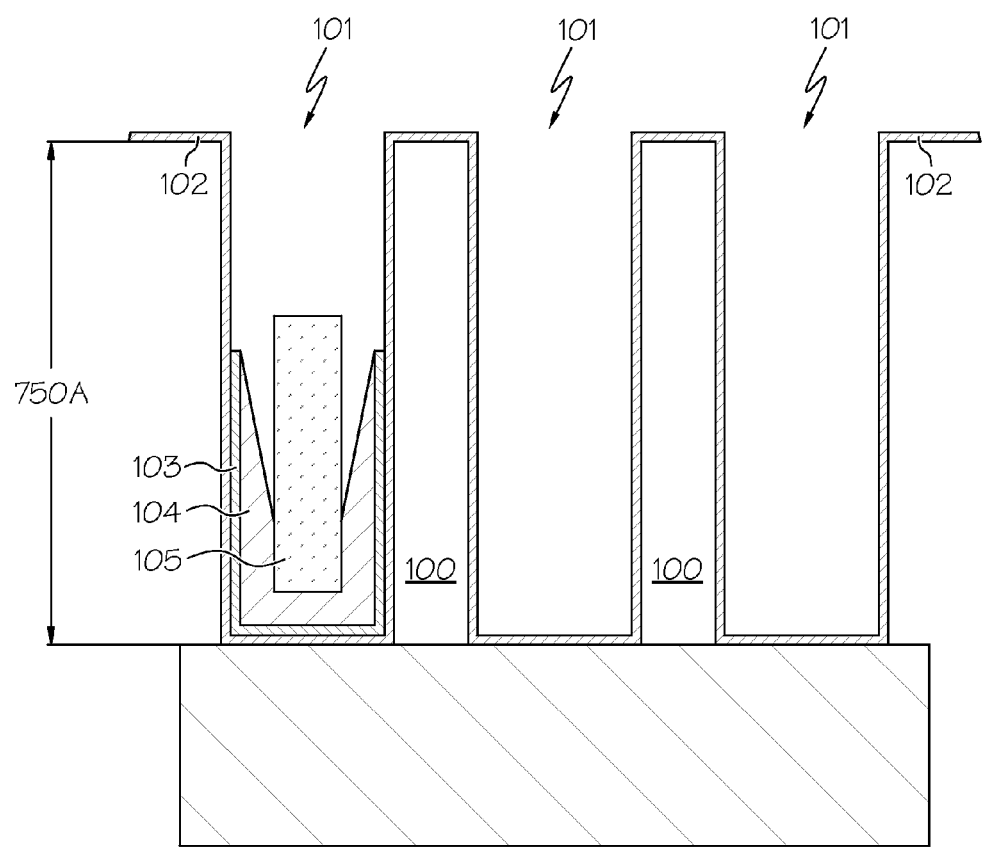
Figure 3B:
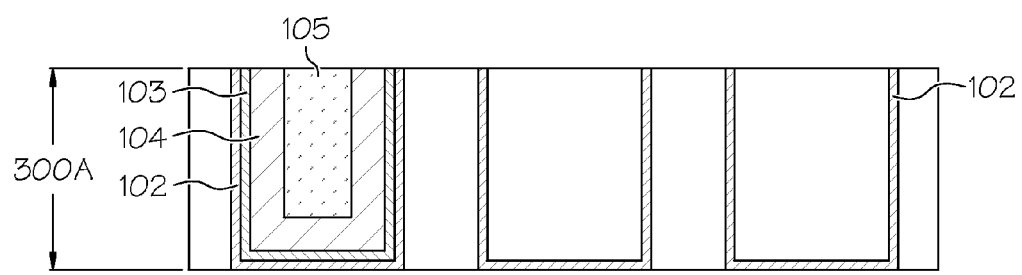

Referring now to FIG. 3, lithographic etching is employed to remove the DUO layer 105 completely from two out of the three trenches. Subsequent to the lithographic etching, a wet etch material is selected that etches both the n-type workfunction material 104 and the DUO material 105. However, the wet etchant is selected so as to attack the n-type workfunction material 104 faster than the DUO material 105. FIG. 3 shows the result of such etching. The two trenches where the DUO material 105 was removed by lithographic etching have the n-type workfunction material 104 completely removed therefrom, as that layer 104 was relatively thin compared to the depth of the trench 101. In contrast, where the DUO material 105 was not lithographically removed, wet etching was performed so as to leave some of both the layer 104 and the layer 105. As the wet etchant attacks the n-type workfunction material 104 faster than the DUO material 105, FIG. 3 shows that more of the n-type workfunction material 104 has been removed as compared to the DUO material 105. In one embodiment, an SC1 mixture ($NH_4OH:H_2O_2:H_2O$) is employed as the wet etchant. It is also noted that the SC1 etchant will etch the TiN layer 103, but not the high-k material layer 102 such as HfO$_2$, which as shown in FIG. 3 remains fully intact.

Figure 4A:
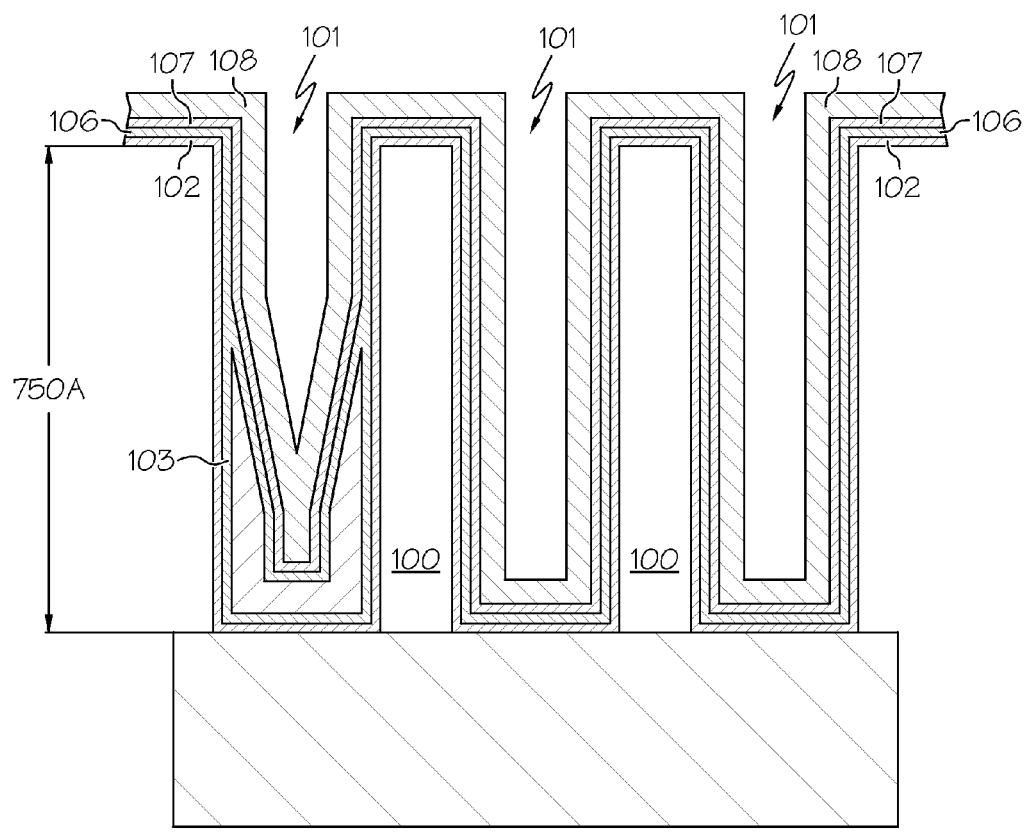
Figure 4B:
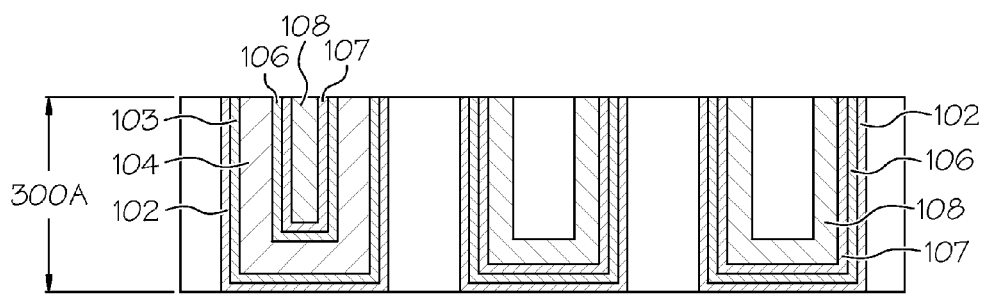

Referring now to FIG. 4, the remaining DUO material 105 is removed using a short exposure to a fluoride-containing solution, for example, 100:1 HF. Thereafter, a further layer of TiN 106, or other suitable barrier material layer as will be known in the art, is deposited conformally over the n-type workfunction layer 104 in the trench where such layer remains, and also over the high-k material layer 102. Subsequently, a layer of TaN 107 is deposited conformally over the TiN layer 106. As will be appreciated, TaN is a known barrier material for separating functional layers in an integrated circuit.

With continued reference to FIG. 4, a p-type workfunction material 108 is deposited. Any material that is on the p-side of the band-gap, and can be deposited using a process that provides for conformal deposition, for example ALD, may be used. In one embodiment, the p-type workfunction material is TiN. TiN has a workfunction of 5.2 eV, and is suitable for use in an ALD processes. As such, a layer of the TiN or other p-type workfunction material 108 is deposited over the TaN layer 107.

Figure 5A:
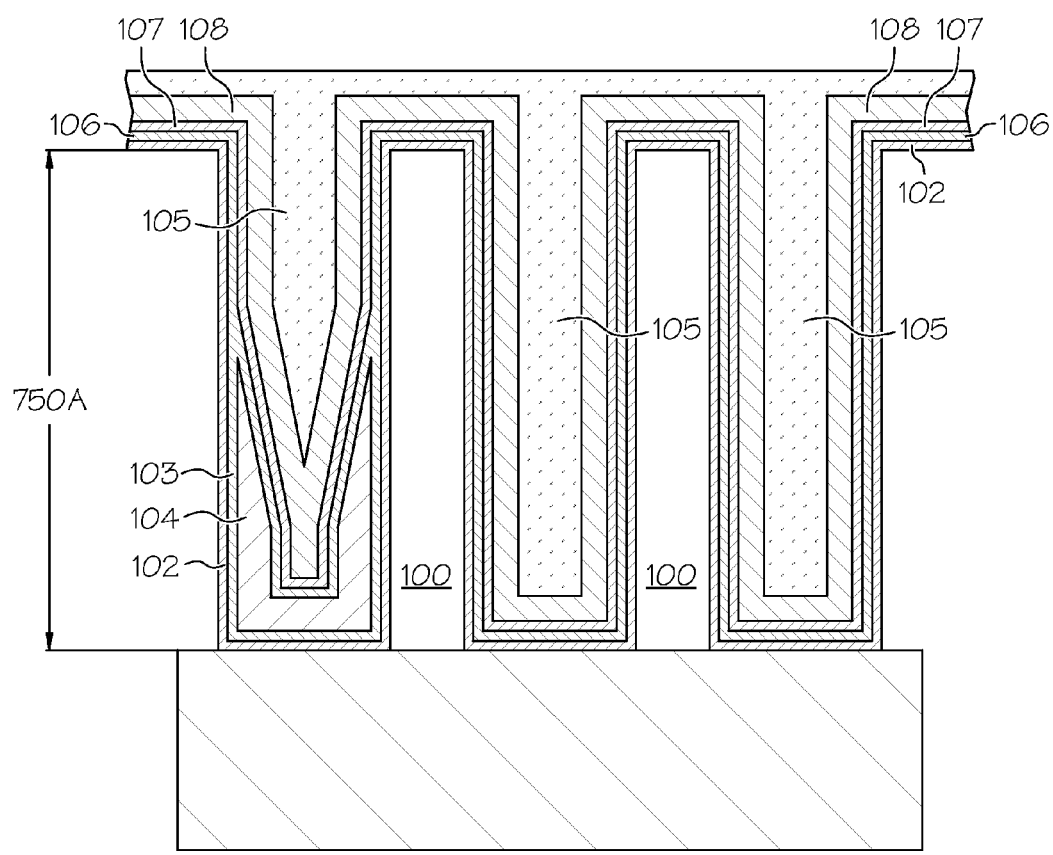
Figure 5B:
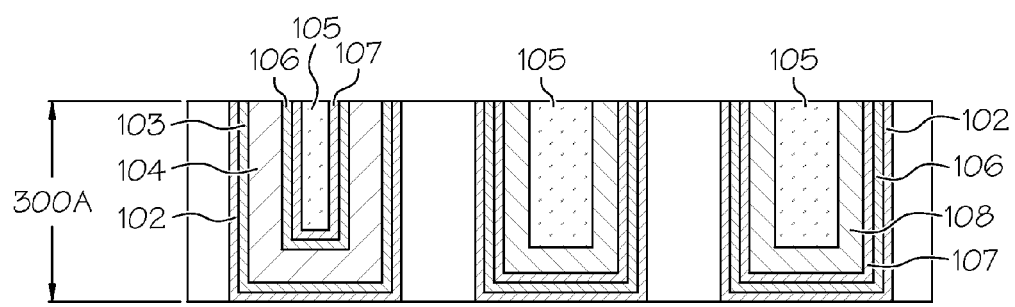

Referring now to FIG. 5, subsequent to the deposition of the p-type workfunction material 108, a layer of a deep ultraviolet light-absorbing oxide (DUO) 105 is conformally deposited. Again, the DUO material is used in connection with deep ultraviolet lithography to for differential etching. As shown in FIG. 5, a DUO layer 105 is deposited over the p-type workfunction layer 104. The DUO layer 105 is also deposited so as to fill the trenches 101. With the DUO layer 105 in place, lithography techniques well-known in the art can be employed to differentially etch the DUO material 105 such that it is only removed from desired locations, using a pattern.

FIGS. 1 through 5 have been thus far described with reference to the deposition of the n-type workfunction material 104 prior to the deposition of the p-type workfunction material 108. However, in other embodiments, it will be appreciated that the p-type workfunction material 108 may be deposited prior to the n-type workfunction material 104. In such embodiments, the associated etching steps would be carried out as described above for each respective n-type workfunction material layer 104 and p-type workfunction material layer 108. As such, it will be appreciated that the methods described herein are not limited to the specific ordering described in the exemplary embodiments presented.

Figure 6A:
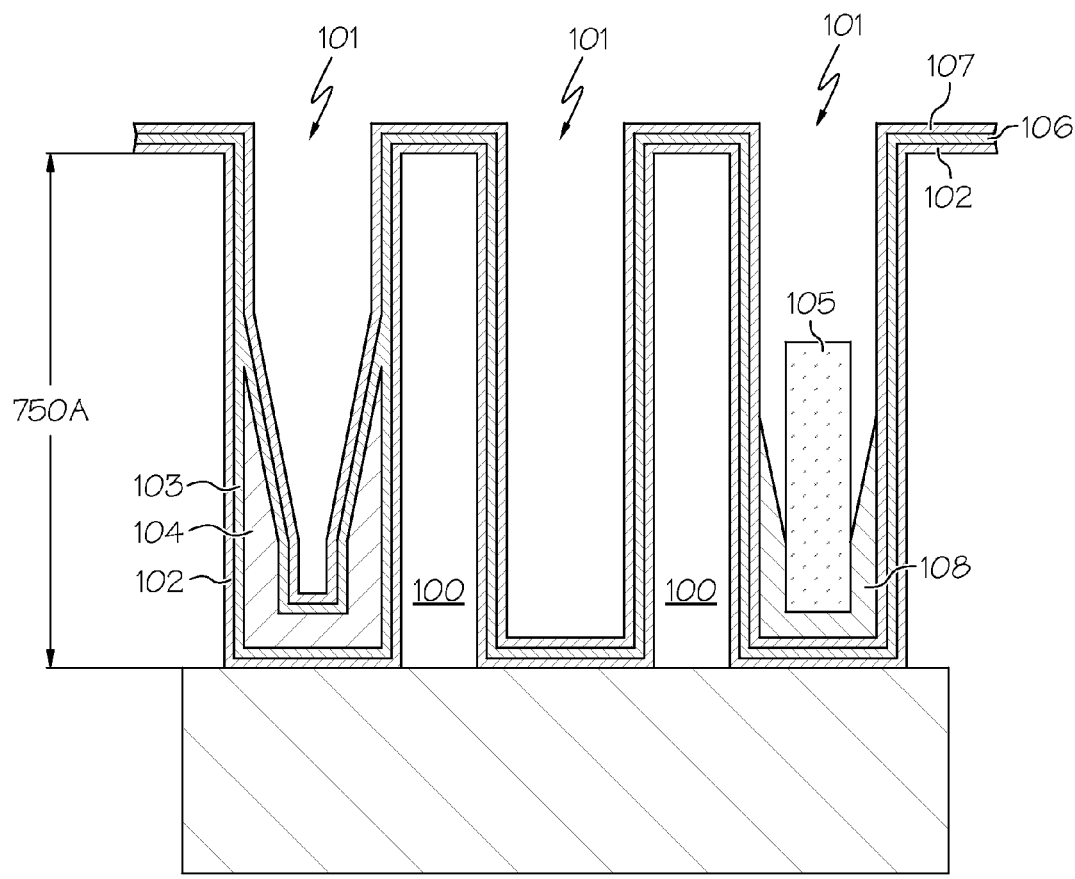
Figure 6B:
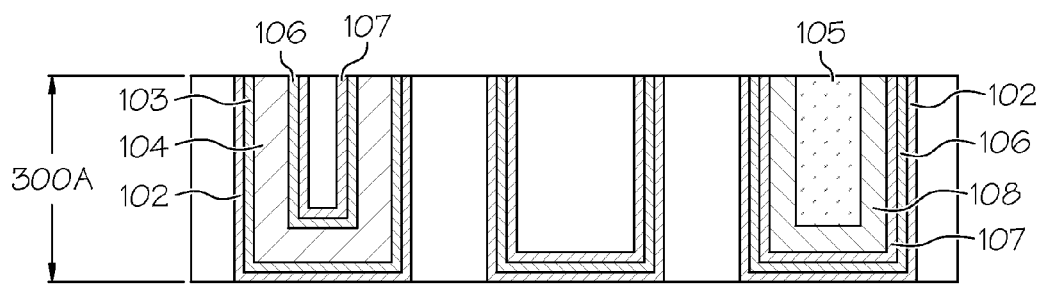

Referring now to FIG. 6, lithographic etching is employed to remove the DUO layer 105 completely from two out of the three trenches. Subsequent to the lithographic etching, a wet etch material is selected that etches both the p-type workfunction material 108 and the DUO material 105. However, the wet etchant is selected so as to attack the p-type workfunction material 108 faster than the DUO material 105. FIG. 6 shows the result of such etching. The two trenches where the DUO material 105 was removed by lithographic etching have the p-type workfunction material 108 completely removed therefrom, as that layer 108 was relatively thin compared to the depth of the trench 101. In contrast, where the DUO material 105 was not lithographically removed, wet etching was performed so as to leave some of both the layer 108 and the layer 105. As the wet etchant attacks the p-type workfunction material 108 faster than the DUO material 105, FIG. 6 shows that more of the p-type workfunction material 108 has been removed as compared to the DUO material 105. In one embodiment, a sulfuric-peroxide mixture is employed as the wet etchant. The sulfuric-peroxide etchant does not attack the TaN layer 107.

Figure 7A:
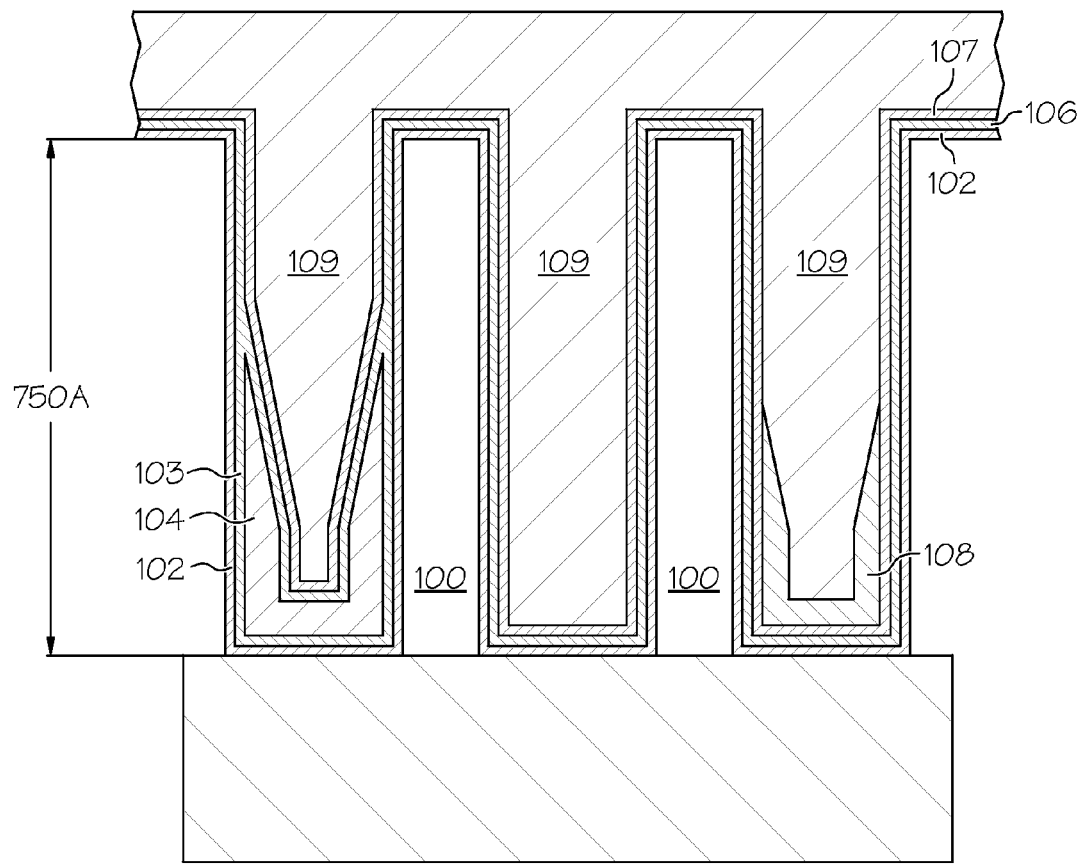
Figure 7B:
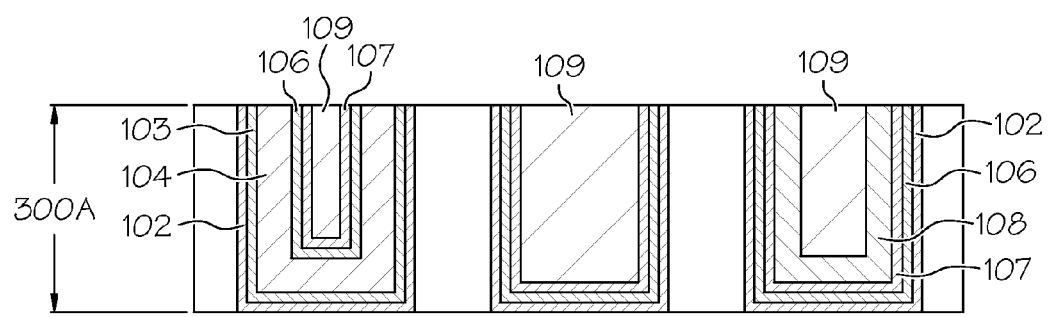

Referring now to FIG. 7, the remaining DUO material 105 is removed using a short exposure to a fluoride-containing solution, for example, 100:1 HF. Thereafter, a low-resistance material layer 109 is deposited over the TaN layer 107 and the p-type workfunction material 108 to fill the trenches 101. In one embodiment, the low-resistance material layer 109 is a low-resistance tungsten (LRW) material, as will be known in the art. In alternative embodiments, it is possible to deposit the low-resistance material prior to the n-type workfunction material 104 deposition or prior to the p-type workfunction material 108 deposition. Again, it will be appreciated that the methods described herein are not limited to the specific ordering described in the exemplary embodiments presented.

Figure 8A:
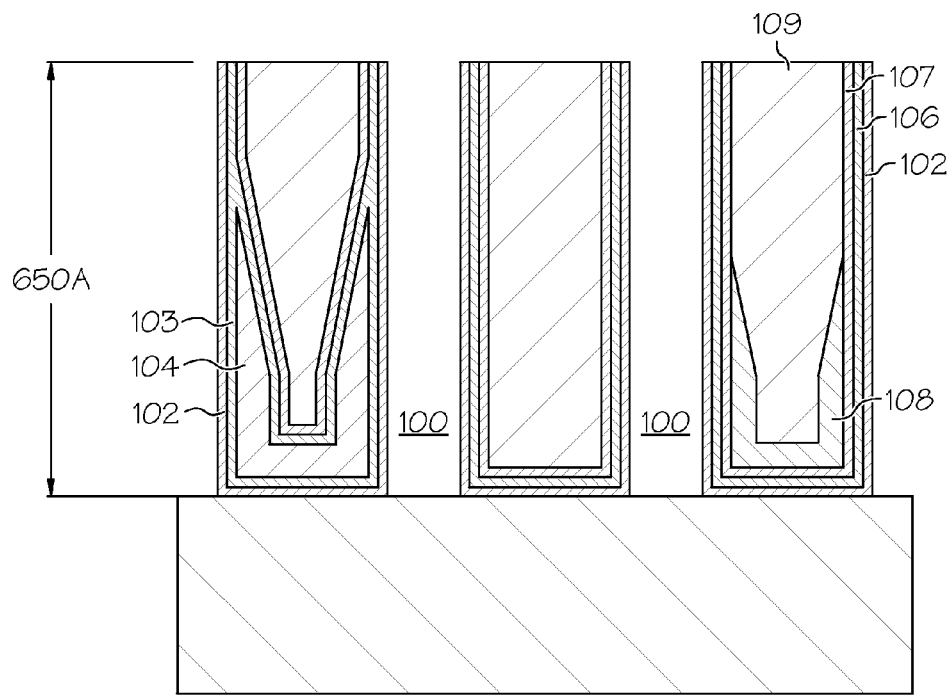
Figure 8B:
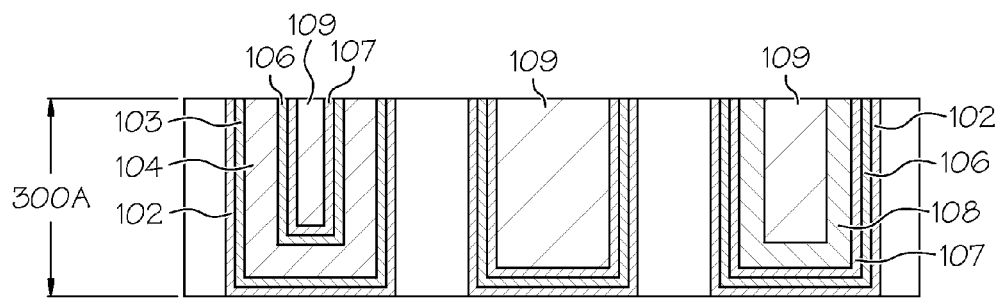
Figure 9A:
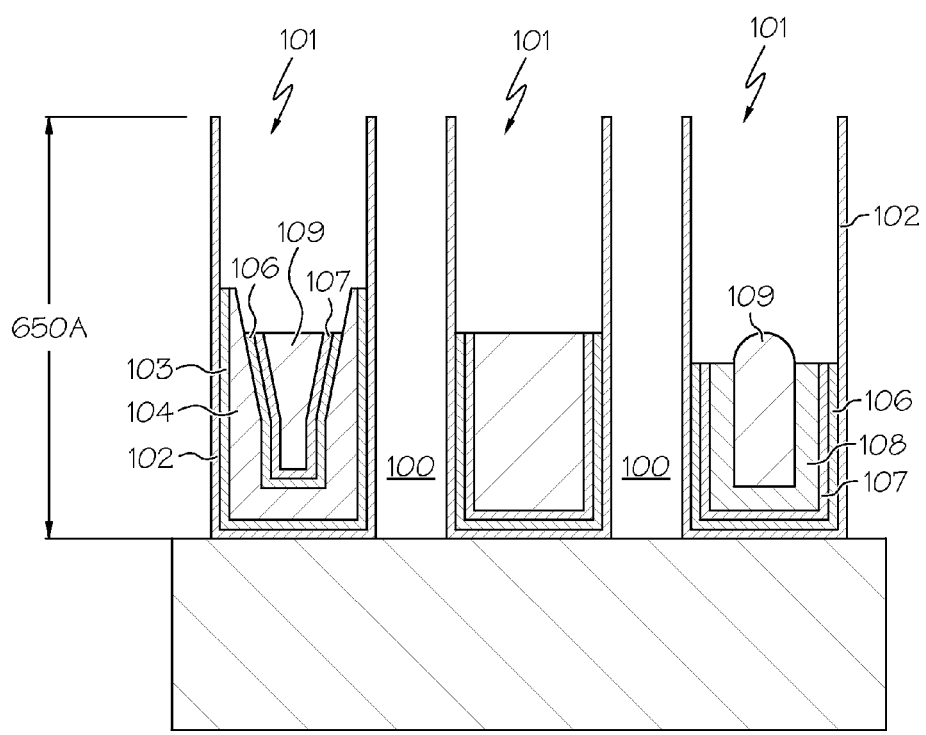
Figure 9B:
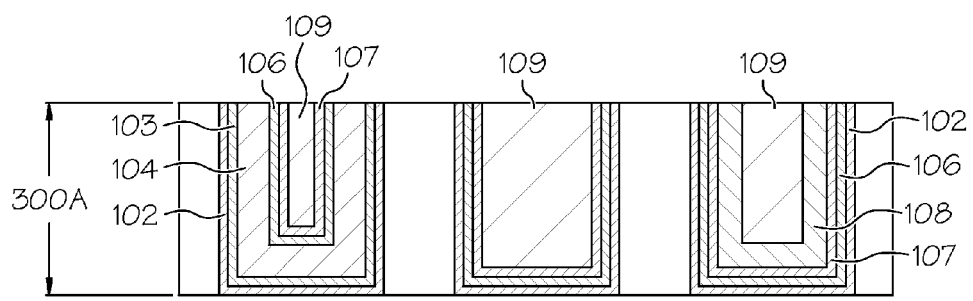

Referring now to FIGS. 8 and 9, a series of etching steps are employed to reduce the height of the layers previous deposited, including the low-resistance material layer 109, the TaN layer 107, the TiN layer 106, and the high-k material layer 102. As shown in FIGS. 8 and 9, compared to FIG. 7, the overall height has been reduced by about 100 Å though such etching, although other reductions through etching are of course possible. Suitable etching processes for these step include, but are not limited to reactive ion etching (RIE). In one embodiment, a series of fluorine- and chlorine-based RIE etches may be employed to remove suitable amounts of layers 109, 107, 106, and 102, as indicated in FIGS. 8 and 9.

Figure 10A:
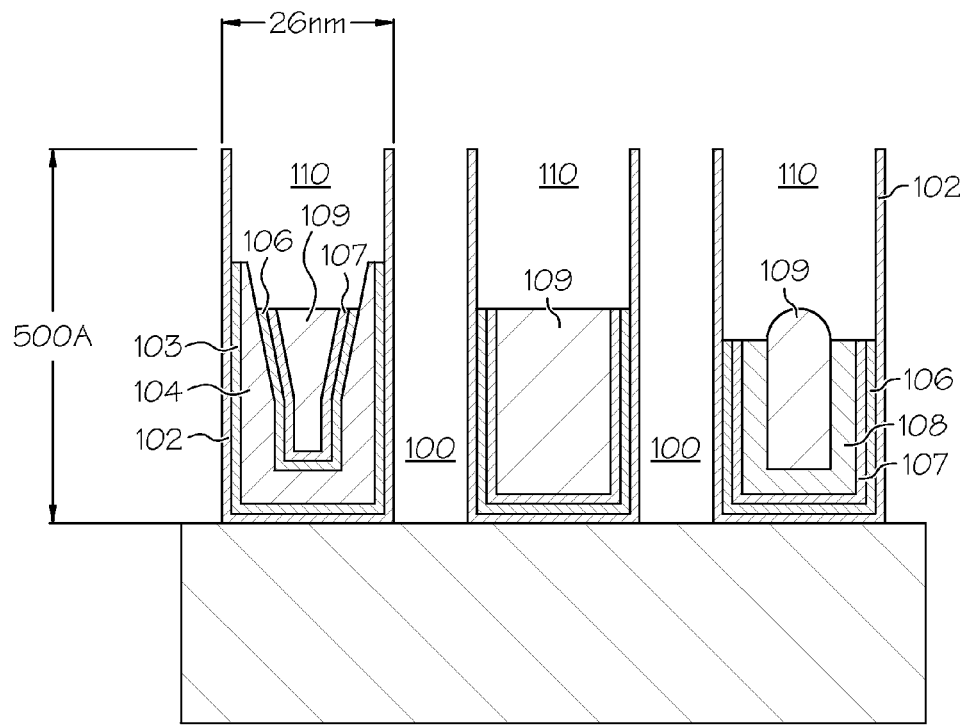
Figure 10B:
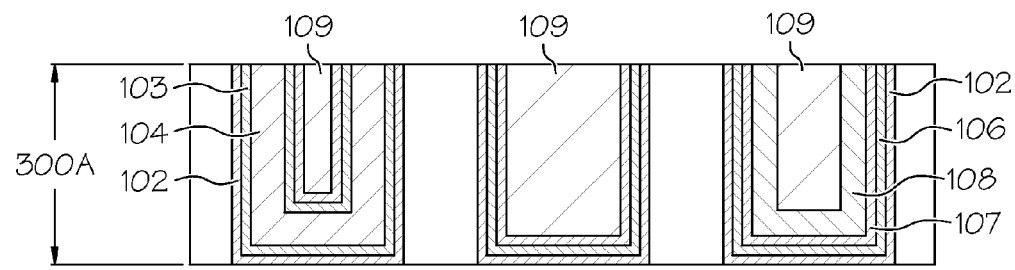

Referring now to FIG. 10, a further process step of depositing a capping layer of SiN 110 is employed. SiN capping layer 110 fills the trenches 101, thereby covering the layers exposed therewithin. SiN, in one embodiment, can be deposited using plasma enhanced chemical vapor deposition (PECVD), although other techniques known in the art can be employed for filling and capping the trenches 101 with SiN. Thereafter, chemical-mechanical planarization, as is known in the art, can be employed to reduce the height of the structures to a desired thickness. Comparing FIG. 10 to FIG. 9, the height has been reduced by an exemplary 150 Å.

The final structure FIG. 10 shows a gate stack which delivers an n-type workfunction gate on the n-side of the band-gap, a mid-gap workfunction because W is a mid-gap metal, and a p-type workfunction gate on the p-side of the band-gap. A SiN cap is on top of all three gates, allowing a self-aligned contact oxide etch selective to nitride to land on top of the gate, thereby preventing shorting of the contact to the gate. As such, the presently described method provides a FinFET structure with multiple workfunctions, suitable for use in current integrated circuit designs that require a range of threshold voltages.

Reference will now be made to FIGS. 11-22, wherein, in an embodiment, process steps in a method for forming a multiple workfunction gate structure are disclosed. As with the previous embodiment, each figure of the presently described embodiment includes two cross-sectional views of the FinFET structure. One is a cross-section along a fin structure and one is a cross-section in between fin structures, as indicated by the cross-sectional reference diagram included with each figure (with arrows therefrom pointing to the indicated cross-section. It is also noted that the figures include reference dimensions for certain of the described features. These reference dimensions are intended to be exemplary only, and as such it will be appreciated that, based on the design of an integrated circuit, the actual dimensions may vary.

Figure 11A:
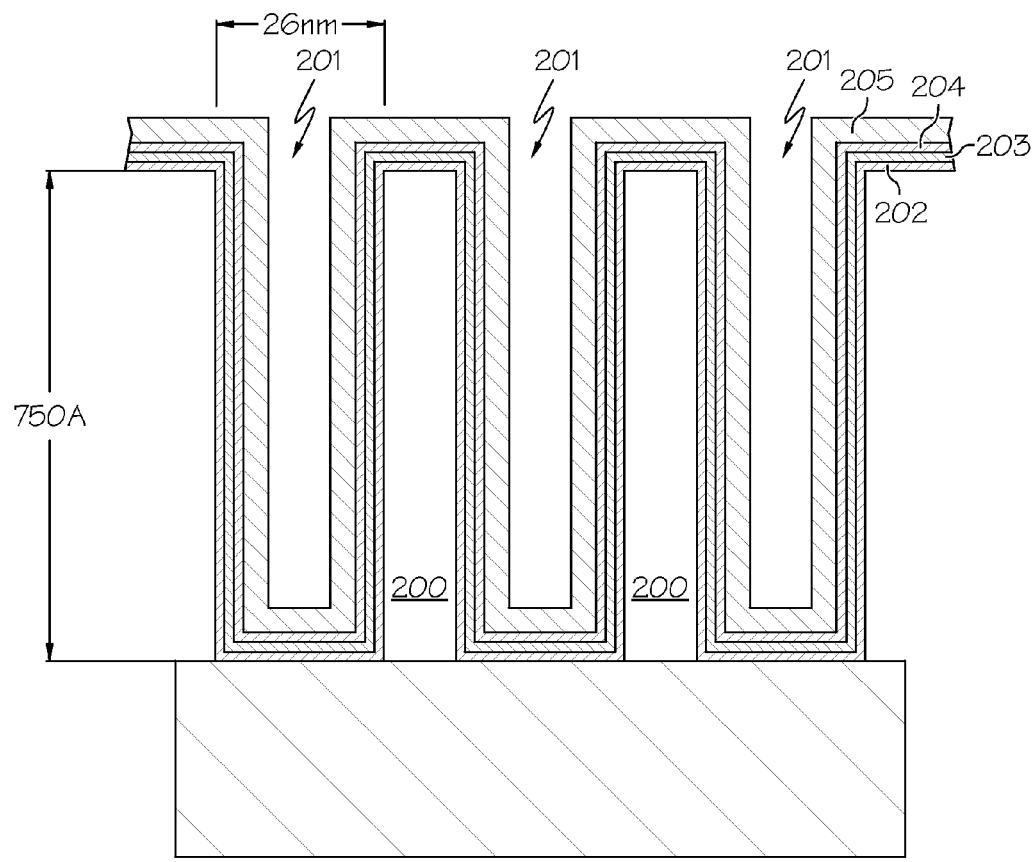
FIGS. 11-22 are partial cross-section views of an integrated circuit system illustrating method steps for forming a multiple workfunction gate structure in accordance with another embodiment.
Figure 11B:
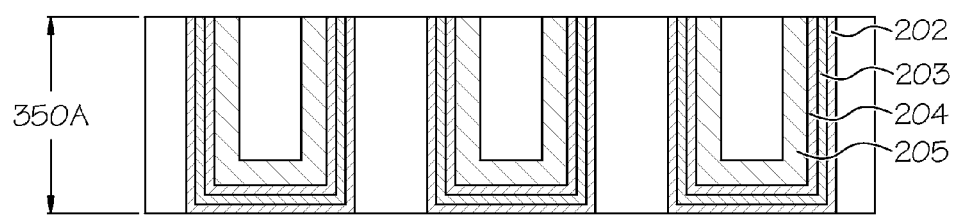

With particular reference now to FIG. 11, a process for forming three gate structures in the fabrication of a FinFET structure is disclosed. The FinFET structure includes a plurality of fins 200, with gaps or "tranches" 201 in between the fins. The exemplary process begins with the deposition of a high-k material 202. The high-k material 202 can include a Hafnium (Hf) or Zirconium (Zr) oxide, or any other metal oxide with sufficient band-gap as are well-known in the art. In an exemplary embodiment, the high-k material 202 is $HfO_2$. The high-k material 202 can be deposited by any technique known in the art that provides for conformal deposition thereof in the trenches 201 and around the fins 200. In one embodiment, the high-k material 202 is deposited using atomic layer deposition (ALD).

With continued reference to FIG. 11, a layer of TiN 203, or other suitable barrier material layer as will be known in the art, is deposited over the high-k material layer 202. This layer 203, in an embodiment, may be about 10 Å in thickness. A sacrificial layer of Si (not shown) deposited over the TiN layer 203. The sacrificial Si layer allows for a subsequent high-temperature annealing of the high-k material 202 to the Si fin 201, thereby improving the high-k material/Si (fin) interface. The sacrificial Si layer is removed after annealing in any suitable manner, for example, anisotropic wet or dry etching. Subsequently, a layer of TaN 204 is deposited conformally over the TiN layer 203. As will be appreciated, TaN is a known barrier material for separating functional layers in an integrated circuit.

With continued reference to FIG. 11, a p-type workfunction material 205 is deposited. Any material that is on the p-side of the band-gap, and can be deposited using a process that provides for conformal deposition, for example ALD, may be used. In one embodiment, the p-type workfunction material is TiN. TiN has a workfunction of 5.2 eV, and is suitable for use in an ALD processes. As such, a layer of the TiN or other p-type workfunction material 205 is deposited over the TaN layer 204.

Figure 12A:
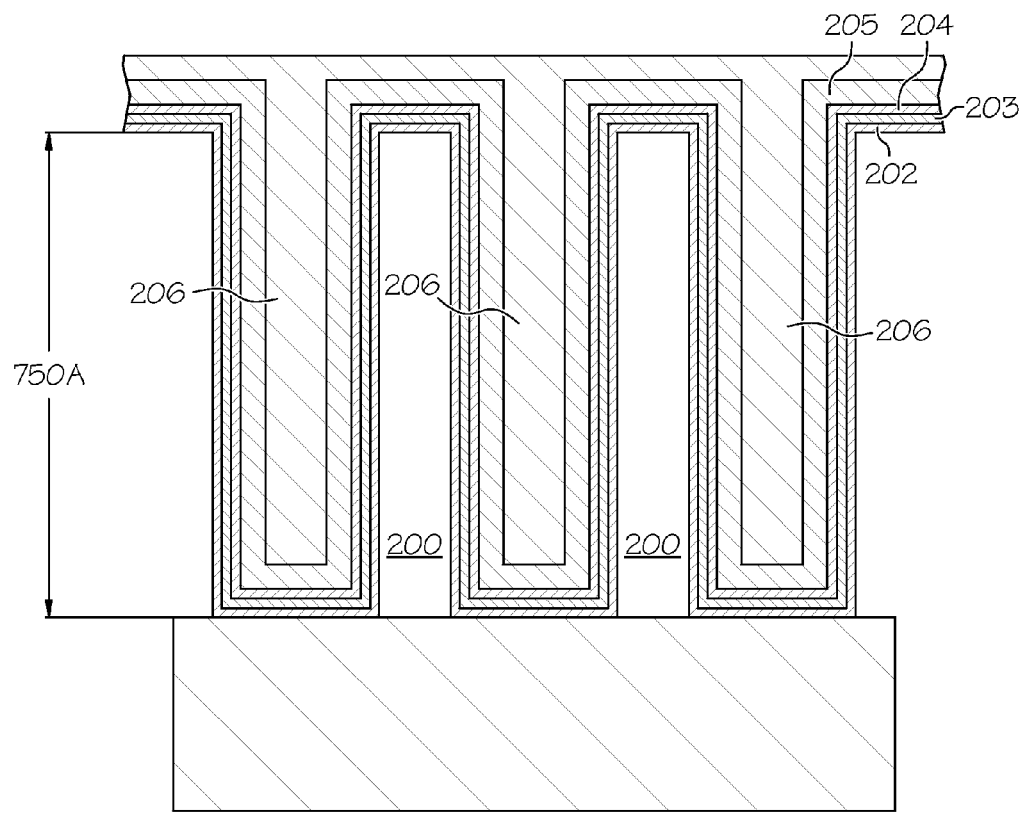
Figure 12B:
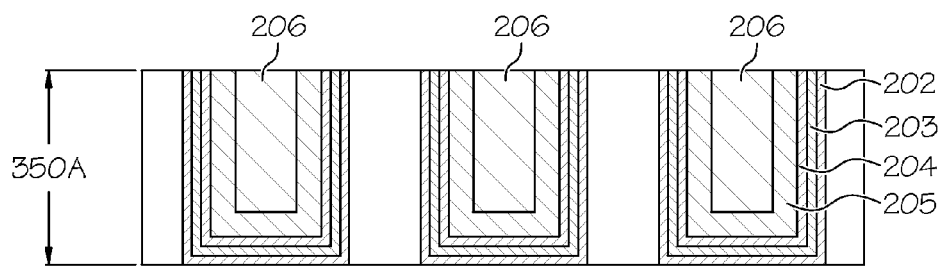

Referring now to FIG. 12, subsequent to the deposition of the p-type workfunction material 205, a layer of a deep ultraviolet light-absorbing oxide (DUO) 206 is conformally deposited. Again, the DUO material is used in connection with deep ultraviolet lithography to for differential etching. As shown in FIG. 12, a DUO layer 206 is deposited over the p-type workfunction layer 205. The DUO layer 206 is also deposited so as to fill the trenches 201. With the DUO layer 206 in place, lithography techniques well-known in the art can be employed to differentially etch the DUO material 206 such that it is only removed from desired locations, using a pattern.

Figure 13A:
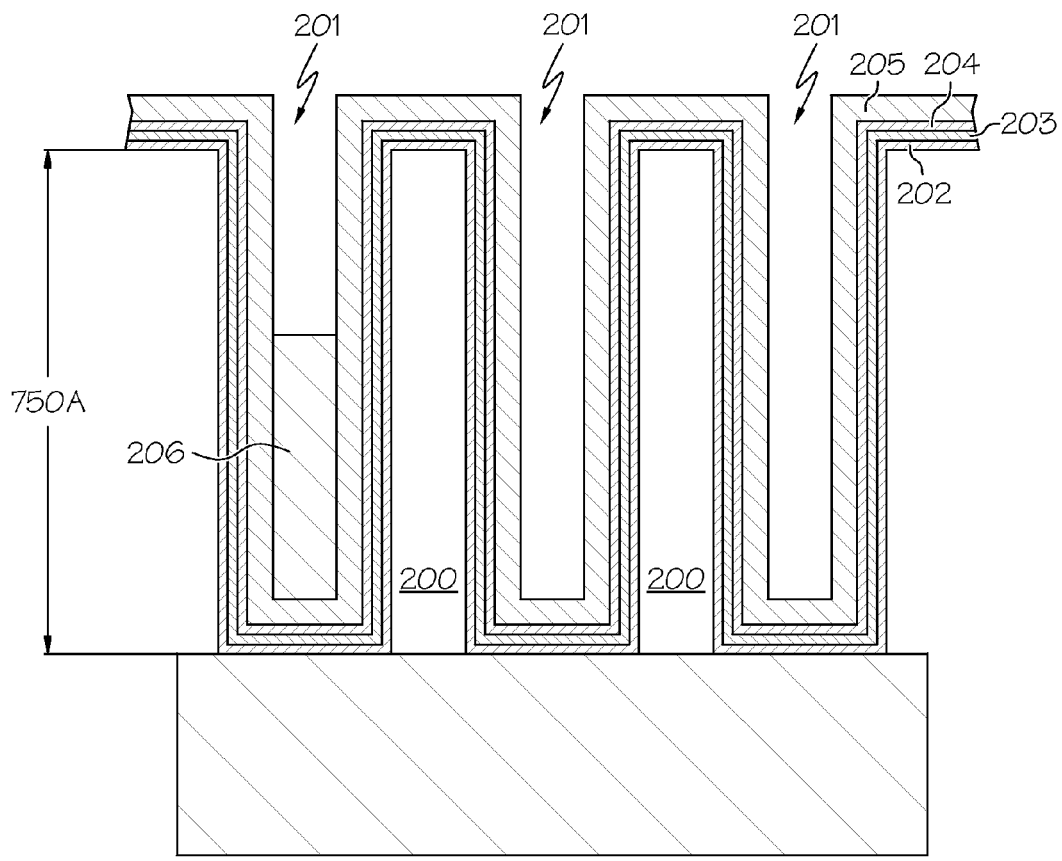
Figure 13B:
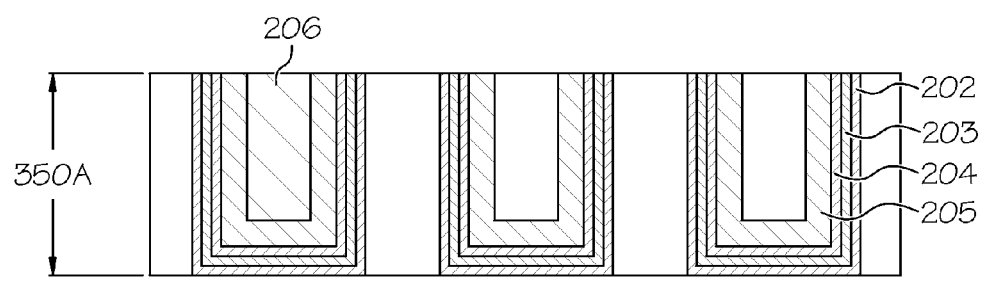
Figure 14A:
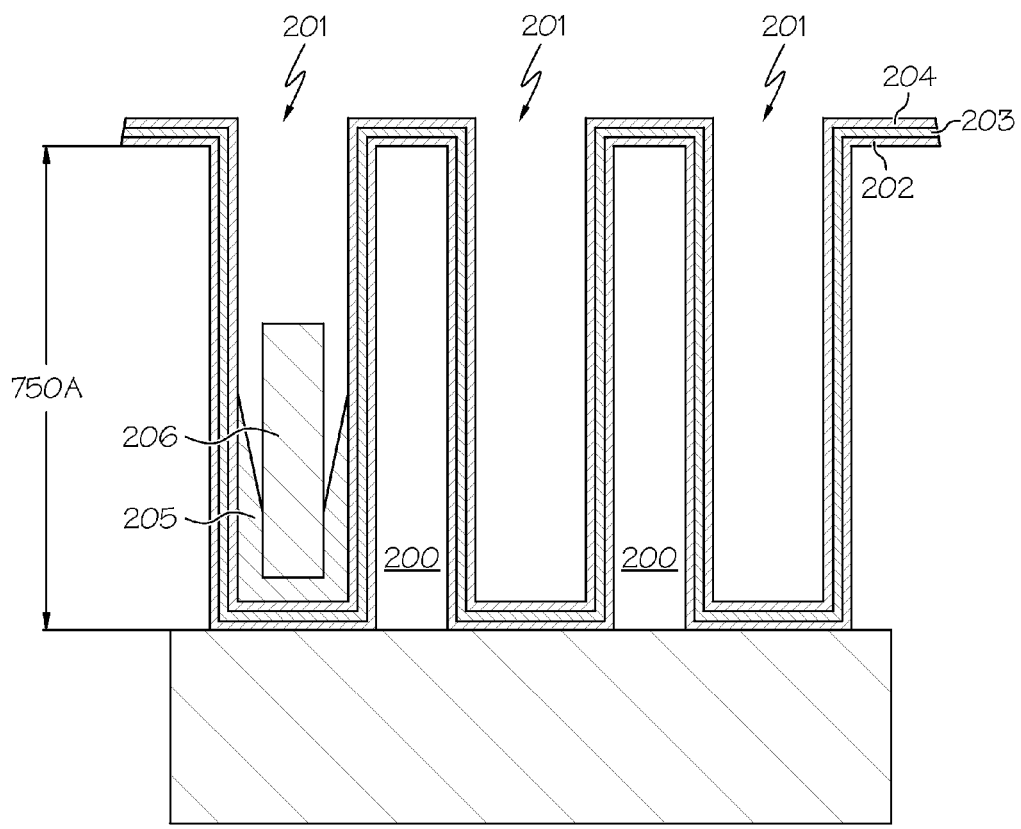
Figure 14B:
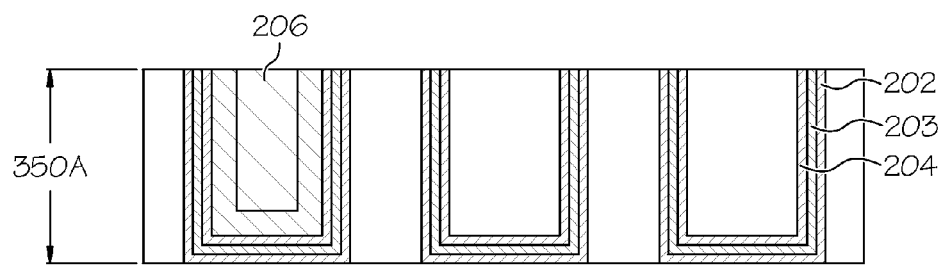

Referring now to FIGS. 13 and 14, lithographic etching is employed to remove the DUO layer 206 completely from two out of the three trenches. Subsequent to the lithographic etching, a wet etch material is selected that etches both the p-type workfunction material 205 and the DUO material 206. However, the wet etchant is selected so as to attack the p-type workfunction material 205 faster than the DUO material 206. FIGS. 13 and 14 show the result of such etching. The two trenches where the DUO material 206 was removed by lithographic etching have the p-type workfunction material 205 completely removed therefrom, as that layer 205 was relatively thin compared to the depth of the trench 201. In contrast, where the DUO material 206 was not lithographically removed, wet etching was performed so as to leave some of both the layer 205 and the layer 206. As the wet etchant attacks the p-type workfunction material 205 faster than the DUO material 206, FIG. 14 shows that more of the p-type workfunction material 205 has been removed as compared to the DUO material 206. In one embodiment, a sulfuric-peroxide mixture is employed as the wet etchant. The sulfuric-peroxide etchant does not attack the TaN layer 204.

Figure 15A:
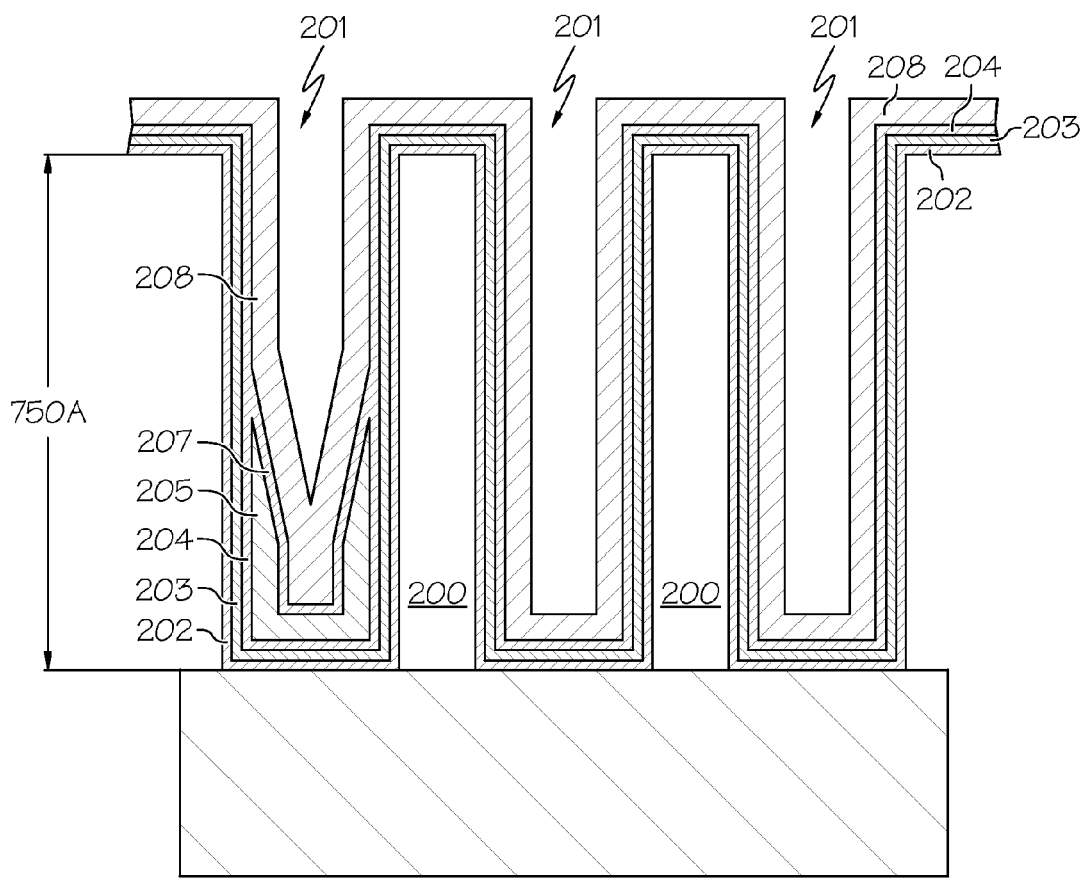
Figure 15B:
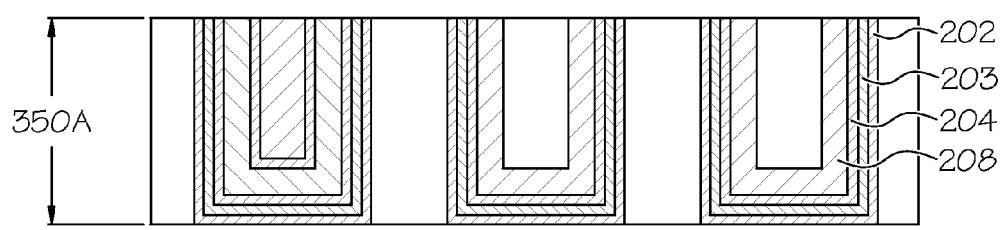

Referring now to FIG. 15, the remaining DUO material 206 is removed using a short exposure to a fluoride-containing solution, for example, 100:1 HF. Further, a layer of TaN 207 is conformally deposited over the remaining p-type workfunction material 205, for example in the manner as described above with regard to FIG. 11. Thereafter, an n-type workfunction material 208 is deposited. Any material that is on the n-side of the band-gap, and can be deposited using a process that provides for conformal deposition, for example ALD, may be used. In one embodiment, the n-type workfunction material is $TiAl_x$. $TiAl_x$ has a workfunction of 4.1 eV, and is suitable for use in an ALD processes. As such, a layer of the $TiAl_x$ or other n-type workfunction material 208 is deposited over the TaN layer 207.

Figure 16A:
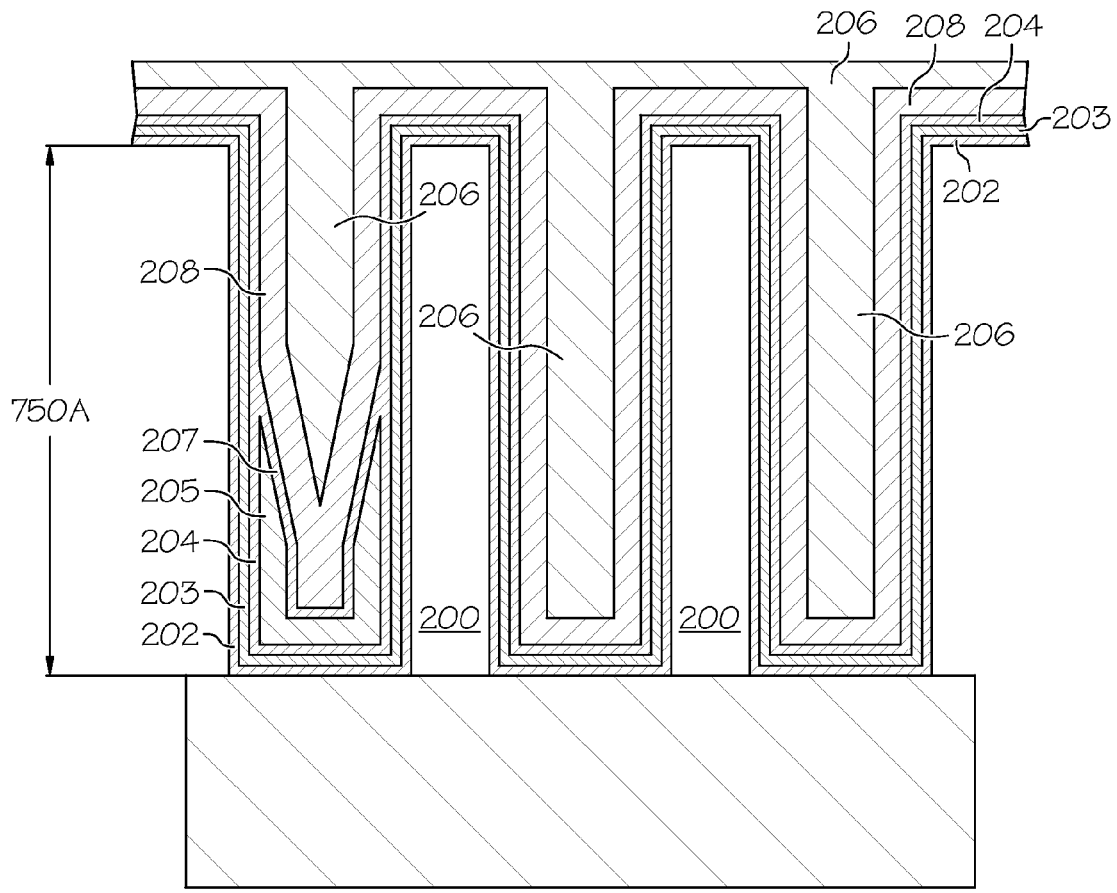
Figure 16B:
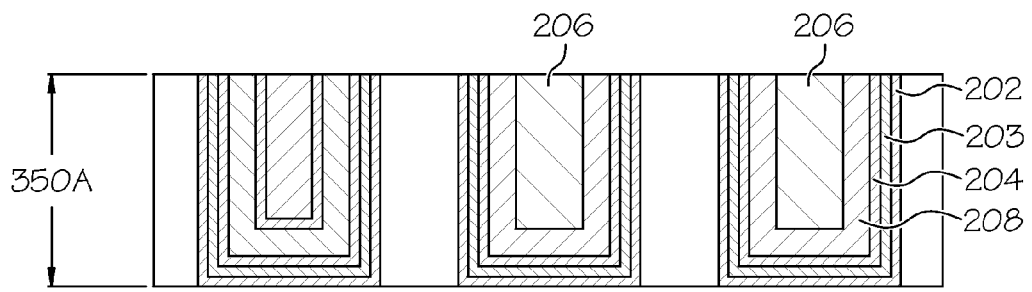

Referring now to FIG. 16, subsequent to the deposition of the n-type workfunction material 208, a layer of a deep ultraviolet light-absorbing oxide (DUO) 206 is conformally deposited. A DUO material is used in connection with deep ultraviolet lithography to for differential etching. As shown in FIG. 16, a DUO layer 206 is deposited over the n-type workfunction layer 208. The DUO layer 206 is also deposited so as to fill the trenches 201. With the DUO layer 206 in place, lithography techniques well-known in the art can be employed to differentially etch the DUO material 206 such that it is only removed from desired locations, using a pattern.

Figure 17A:
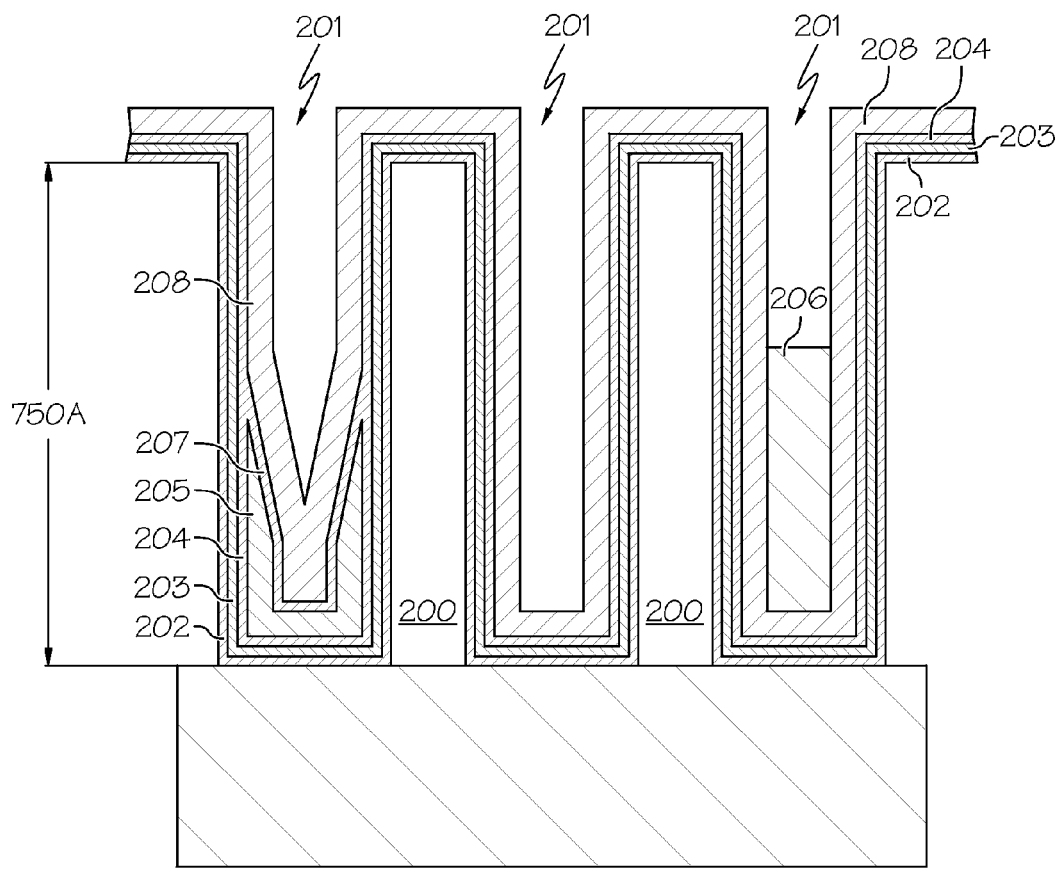
Figure 17B:
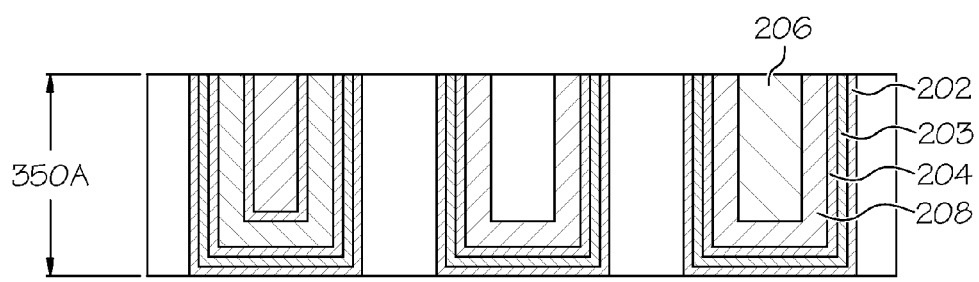
Figure 18A:
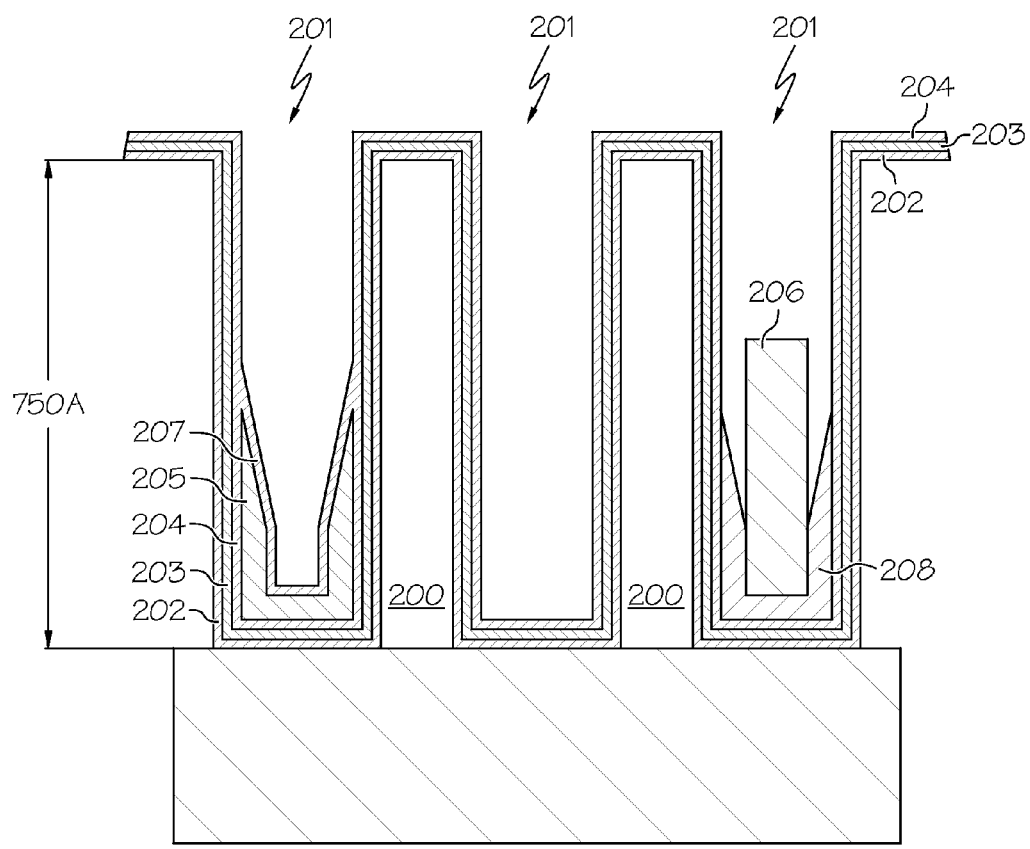
Figure 18B:
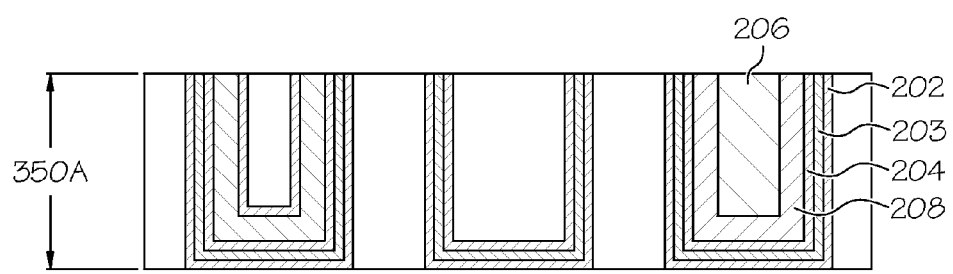

Referring now to FIGS. 17 and 18, lithographic etching is employed to remove the DUO layer 206 completely from two out of the three trenches. Subsequent to the lithographic etching, a wet etch material is selected that etches both the n-type workfunction material 208 and the DUO material 206. However, the wet etchant is selected so as to attack the n-type workfunction material 208 faster than the DUO material 206. FIGS. 17 and 18 shows the result of such etching. The two trenches where the DUO material 206 was removed by lithographic etching have the n-type workfunction material 208 completely removed therefrom, as that layer 208 was relatively thin compared to the depth of the trench 201. In contrast, where the DUO material 206 was not lithographically removed, wet etching was performed so as to leave some of both the layer 208 and the layer 206. As the wet etchant attacks the n-type workfunction material 208 faster than the DUO material 206, FIG. 18 shows that more of the n-type workfunction material 208 has been removed as compared to the DUO material 206. In one embodiment, an SC1 mixture ($NH_4OH:H_2O_2:H_2O$) is employed as the wet etchant. It is also noted that the SC1 etchant will not etch the TaN layers 204 or 207.

Figure 19A:
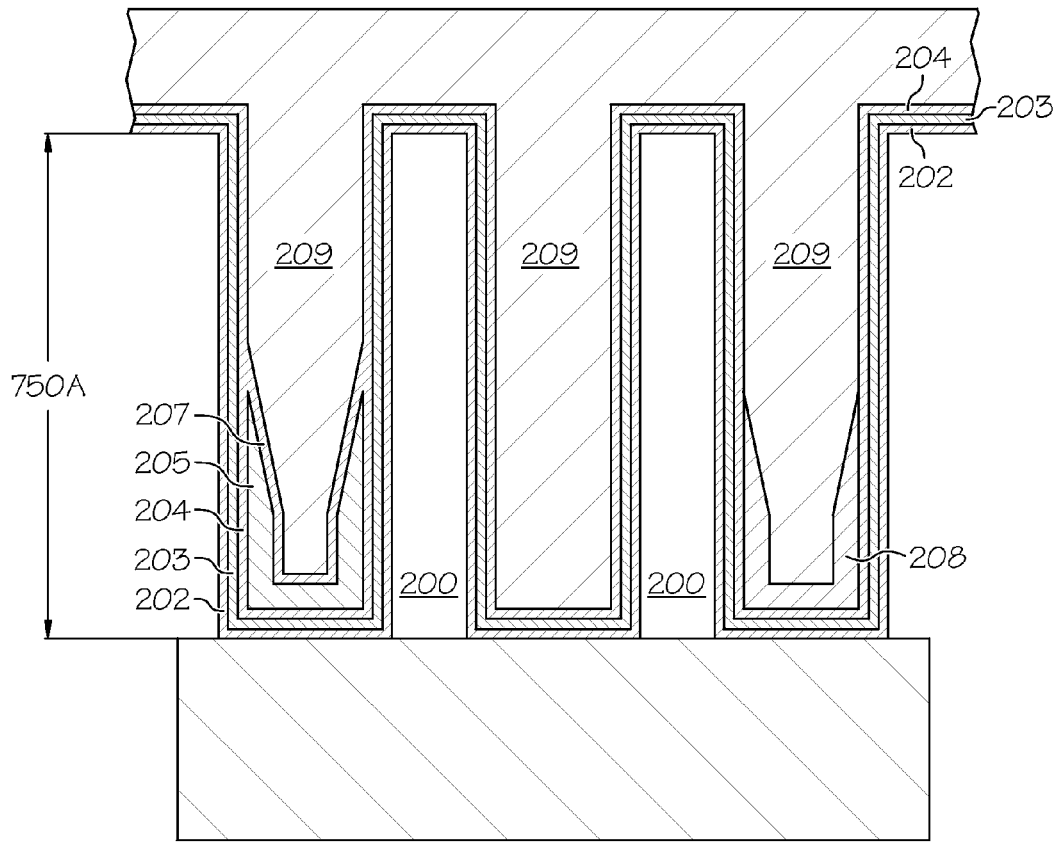
Figure 19B:
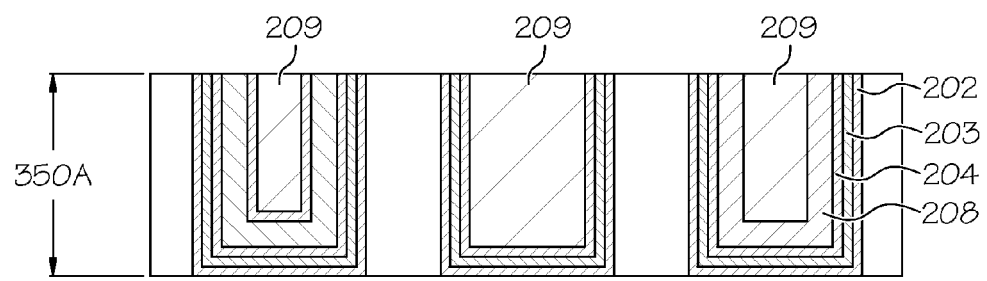

Referring now to FIG. 19, the remaining DUO material 206 is removed using a short exposure to a fluoride-containing solution, for example, 100:1 HF. Thereafter, a low-resistance material layer 209 is deposited over the TaN layers 204, 207 and the n-type workfunction material 208 to fill the trenches 201. In one embodiment, the low-resistance material layer 209 is a low-resistance tungsten (LRW) material, as will be known in the art.

Figure 20A:
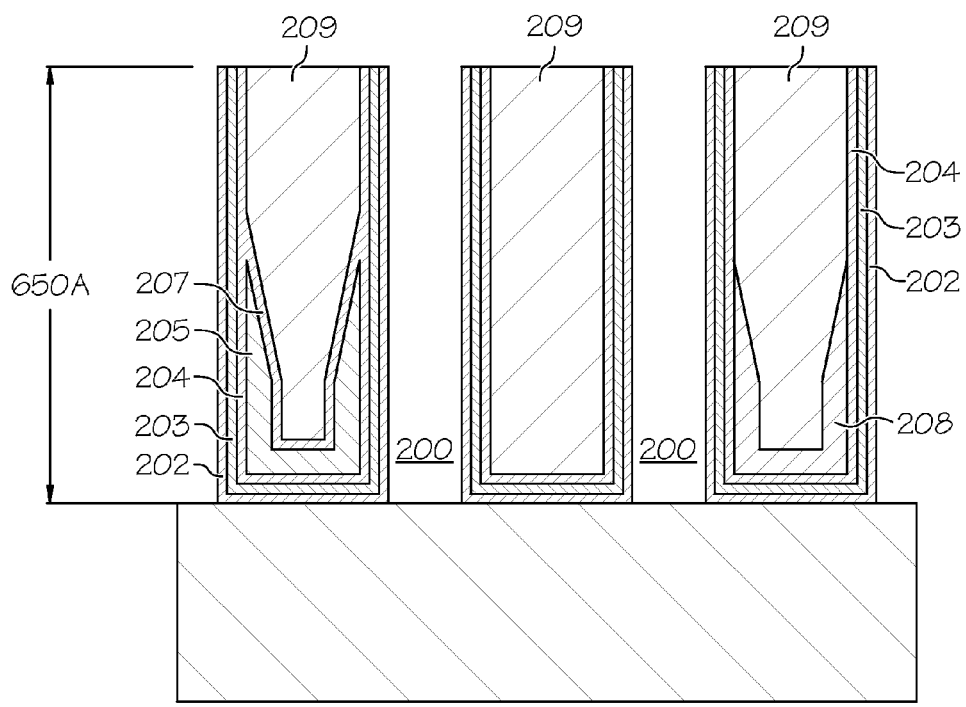
Figure 20B:
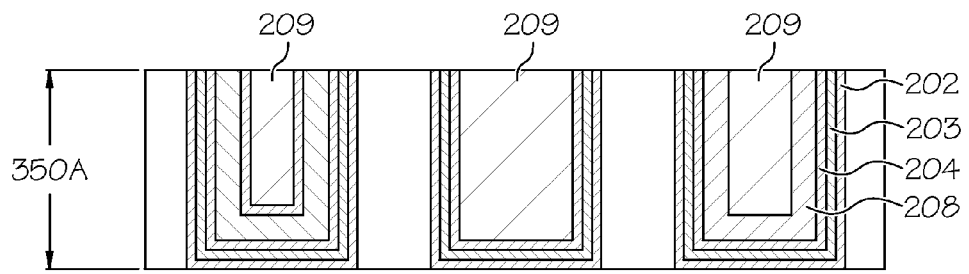
Figure 21A:
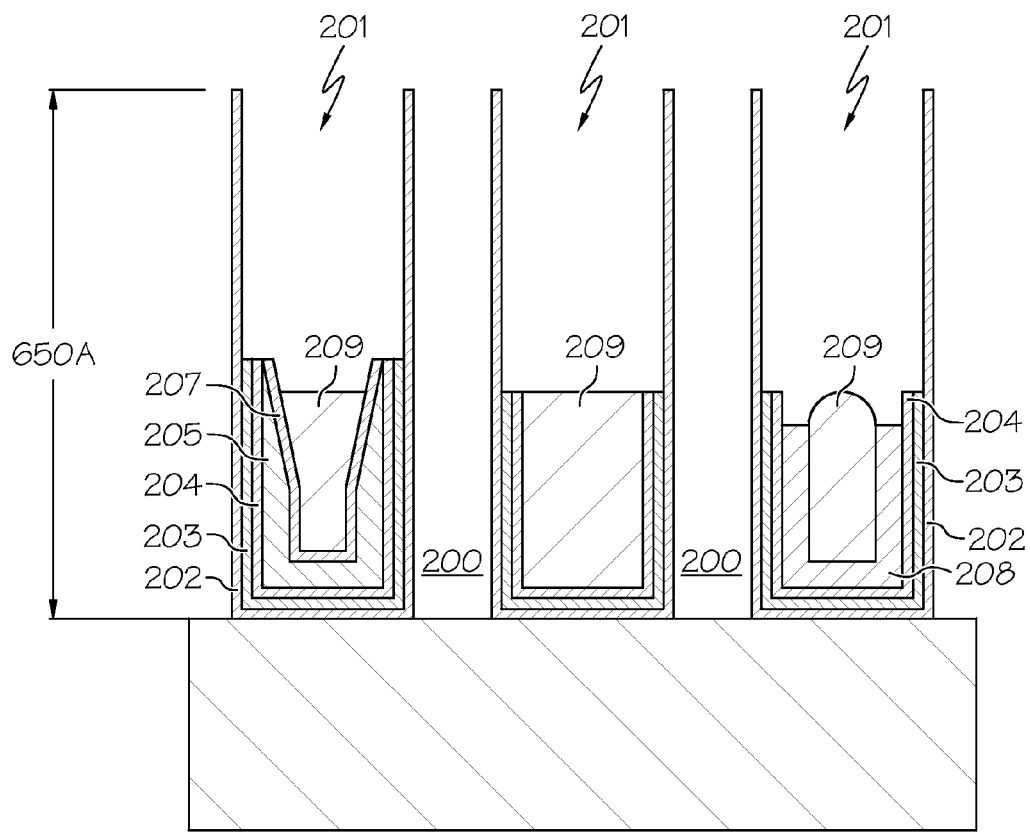
Figure 21B:
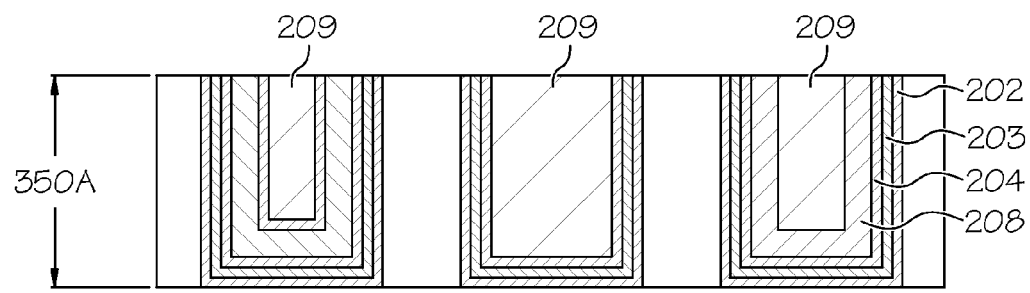

Referring now to FIGS. 20 and 21, a series of etching steps are employed to reduce the height of the layers previous deposited, including the low-resistance material layer 209, the TaN layer 204, the TiN layer 203, and the high-k material layer 202. As shown in FIGS. 20 and 21, compared to FIG. 19, the overall height has been reduced by about 100 Å though such etching, although other reductions through etching are of course possible. Suitable etching processes for these steps include, but are not limited to reactive ion etching (RIE). In one embodiment, a series of fluorine- and chlorine-based RIE etches may be employed to remove suitable amounts of layers 209, 204, 203, and 202, as indicated in FIGS. 20 and 21.

Figure 22A:
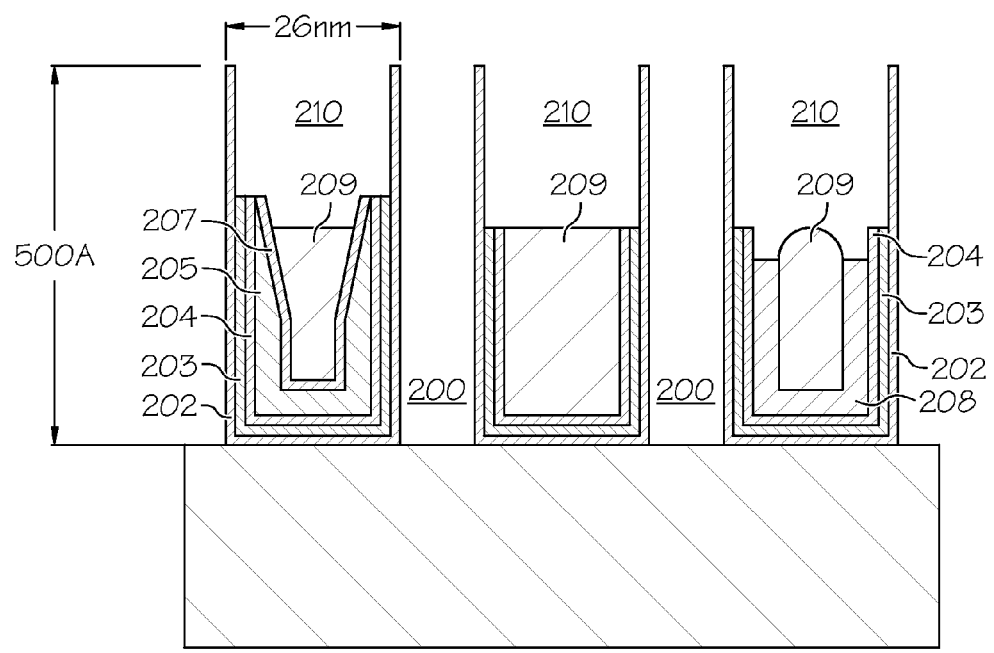
Figure 22B:
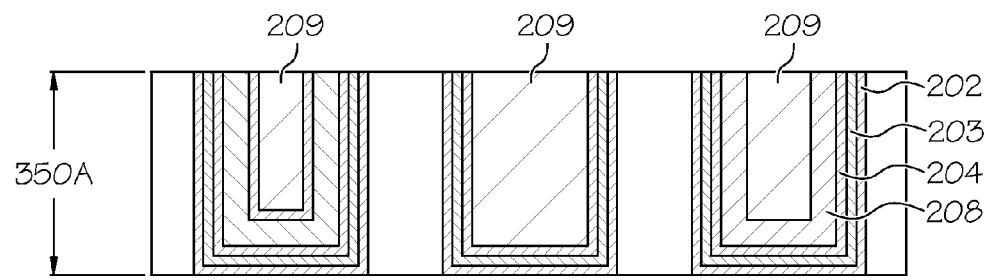

Referring now to FIG. 22, a further process step of depositing a capping layer of SiN 210 is employed. SiN capping layer 210 fills the trenches 201, thereby covering the layers exposed therewithin. SiN, in one embodiment, can be deposited using plasma enhanced chemical vapor deposition (PECVD), although other techniques known in the art can be employed for filling and capping the trenches 201 with SiN. Thereafter, chemical-mechanical planarization, as is known in the art, can be employed to reduce the height of the structures to a desired thickness. Comparing FIG. 22 to FIG. 21, the height has been reduced by an exemplary 150 Å.

The final structure FIG. 22 shows a gate stack which delivers an n-type workfunction gate on the n-side of the band-gap, a mid-gap workfunction because W is a mid-gap metal, and a p-type workfunction gate on the p-side of the band-gap. A SiN cap is on top of all three gates, allowing a self-aligned contact oxide etch selective to nitride to land on top of the gate, thereby preventing shorting of the contact to the gate. As such, the presently described method, in this further embodiment, provides a FinFET structure with multiple workfunctions, suitable for use in current integrated circuit designs that require a range of threshold voltages.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for fabricating a multiple-workfunction FinFET structure, comprising:
   depositing an n-type workfunction material in a layer over a plurality of fins and in a plurality of trenches between said fins;
   depositing a deep ultraviolet light-absorbing oxide (DUO) material over the n-type workfunction material layer;
   differentially etching the DUO material so as to completely remove the DUO material from all but a first trench of the plurality of trenches, wherein at least a portion of the n-type workfunction material remains in the first trench;
   depositing a p-type workfunction material in a layer over the plurality of fins and in the plurality of trenches between said fins;
   depositing a DUO material over the p-type workfunction material layer;
   differentially etching the DUO material so as to completely remove the DUO material from all but a second trench of the plurality of trenches, wherein at least a portion of the p-type workfunction material remains in the second trench; and
   depositing a mid-gap workfunction material in a layer over the plurality of fins and in the plurality of trenches.

2. The method of claim 1, further comprising etching at least part of the mid-gap workfunction material and capping the plurality of trenches with a SiN material.

3. The method of claim 2, wherein etching the at least part of the mid-gap workfunction material comprises fluorine- or chlorine-based reactive ion etching.

4. The method of claim 1, further comprising depositing a high-k material prior to depositing the n-type workfunction material layer.

5. The method of claim 4, wherein the high-k material is hafnium oxide or a zirconium oxide.

6. The method of claim 4, further comprising depositing a capping material over the high-k material.

7. The method of claim 6, wherein the capping material is TiN.

8. The method of claim 1, wherein depositing the n-type workfunction material layer is performed prior to depositing the p-type workfunction material layer.

9. The method of claim 8, wherein the n-type workfunction material is TaC.

10. The method of claim 1, wherein depositing the p-type workfunction material layer is performed prior to depositing the n-type workfunction material layer.

11. The method of claim 10, wherein the n-type workfunction material is a $TiAl_x$ material.

12. The method of claim 1, wherein the p-type workfunction material is TiN.

13. The method of claim 1, wherein the mid-gap workfunction material is a low-resistivity material.

14. The method of claim 13, wherein the low-resistivity material is a low-resistivity tungsten (LRW) material.

15. The method of claim 1, wherein etching the DUO material comprises photolithographic etching.

16. The method of claim 15, wherein etching of the DUO material further comprises using an HF etchant mixture.

17. The method of claim 1, wherein the first trench is separated from the second trench by a third trench.

18. The method of claim 1, further comprising depositing one or more TaN layers.

19. A method for fabricating a multiple-workfunction FinFET structure, comprising:
   depositing a first workfunction material in a layer in a plurality of trenches of the FinFET structure;
   depositing a photoactive etching material over the first workfunction material layer;
   differentially etching the photoactive etching material so as to completely remove the photoactive etching material from all but a first trench of the plurality of trenches, wherein at least a portion of the first workfunction material remains in the first trench;
   depositing a second workfunction material in a layer in the plurality of trenches;
   depositing a photoactive etching material over the second workfunction material layer;
   differentially etching the photoactive etching material so as to completely remove the photoactive etching material from all but a second trench of the plurality of trenches, wherein at least a portion of the second workfunction material remains in the second trench; and
   depositing a third workfunction material in a layer in the plurality of trenches.

20. A method for fabricating a multiple-workfunction FinFET structure, comprising:
   depositing a first workfunction material in a layer in a plurality of trenches of the FinFET structure;
   etching the first workfunction material layer so as to completely remove the first workfunction material layer from all but a first trench of the plurality of trenches;
   depositing a second workfunction material in a layer in the plurality of trenches;

etching the second workfunction material layer so as to completely remove the second workfunction material layer from all but a second trench of the plurality of trenches; and depositing a third workfunction material in a layer in the plurality of trenches.

* * * * *